(12) United States Patent
Kimura et al.

(10) Patent No.: US 6,407,486 B1
(45) Date of Patent: Jun. 18, 2002

(54) SURFACE ACOUSTIC WAVE DEVICE

(75) Inventors: Noritoshi Kimura; Masahiro Nakano; Katsuo Sato, all of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/696,281

(22) Filed: Oct. 26, 2000

Related U.S. Application Data

(63) Continuation of application No. PCT/JP99/05608, filed on Oct. 12, 1999.

(30) Foreign Application Priority Data

May 31, 1999 (JP) .......................................... 11-152795

(51) Int. Cl.[7] .............................................. H03H 9/25
(52) U.S. Cl. ................................... 310/364; 310/313 A
(58) Field of Search ............................ 310/313 A, 363, 310/364

(56) References Cited

U.S. PATENT DOCUMENTS

| | | | | |
|---|---|---|---|---|
| 5,152,864 A | | 10/1992 | Ieki et al. ..................... | 136/610 |
| 5,558,711 A | | 9/1996 | Sakurai ........................ | 117/84 |
| 5,929,723 A | | 7/1999 | Kimura et al. ............... | 333/193 |
| 6,037,847 A | * | 3/2000 | Ueda et al. .................. | 333/193 |
| 6,259,185 B1 | * | 7/2001 | Lai ........................ | 310/313 B |
| 6,316,860 B1 | * | 11/2001 | Kimura et al. .......... | 310/313 A |
| 6,317,015 B1 | * | 11/2001 | Ueda et al. .............. | 310/313 A |

FOREIGN PATENT DOCUMENTS

| | | | | |
|---|---|---|---|---|
| DE | 196 41 662 | 4/1997 | ............ | H03H/9/64 |
| EP | 0 392 879 | 10/1990 | ............ | H03H/9/25 |
| EP | 0 524 754 A2 | 1/1993 | ......... | H01L/23/532 |
| JP | 57-159113 | 10/1982 | ............ | H03H/9/25 |
| JP | 59-55615 | 3/1984 | .......... | H03H/9/145 |
| JP | 62-168411 | 7/1987 | ............ | H03H/9/25 |
| JP | 2545983 | 3/1991 | .......... | H03H/9/145 |
| JP | 5-90268 | 4/1993 | ....... | H01L/21/3205 |
| JP | 5-183373 | 7/1993 | .......... | H03H/9/145 |
| JP | 5-199062 | 8/1993 | .......... | H03H/9/145 |
| JP | 5-226337 | 9/1993 | ....... | H01L/21/3205 |
| JP | 7-135443 | 5/1995 | .......... | H03H/9/145 |
| JP | 8-139546 | 5/1996 | ............ | H03H/9/25 |
| JP | 8-154030 | 6/1996 | .......... | H03H/9/145 |
| JP | 2888158 | 7/1996 | ............ | H03H/3/08 |
| JP | 8-195635 | 7/1996 | ............ | H03H/3/08 |
| JP | 8-340233 | 12/1996 | ............ | H03H/3/08 |
| JP | 9-199969 | 7/1997 | ............ | H03H/3/08 |
| WO | WO 99/16168 | 4/1999 | .......... | H03H/9/145 |
| WO | WO99/16168 | * 4/1999 | ............ | 310/313 A |

OTHER PUBLICATIONS

Atsushi Kamijo and Tsutomu Mitsuzuka, A highly oriented A1[111] texture developed on ultrathin metal underlayers, Apr. 15, 1995, pp. 3799–3804, 1995 American Institute of Physics.

Noritoshi Kimura, Masahiro Nakano and Katsuo Sato, High Power–Durable and Low Loss Single–Crystalline A1/Ti Electrodes for RF SAW Devices, Jul. 1998, pp. 315–318, 1998 IEEE Ultrasonics Symposium.

* cited by examiner

Primary Examiner—Thomas M. Dougherty
(74) Attorney, Agent, or Firm—Oblon, Spivak, McClelland, Maier & Neustadt, P.C.

(57) ABSTRACT

An object of the invention is to provide a SAW device having an electrode film on a lithium tantalate substrate having a cut angle approximate to 36 degree rotated Y cut, the electrode film including an aluminum single crystal film having improved power durability.

The SAW device has interdigital electrodes on a substrate. The substrate is constructed of a 38 to 44 degree rotated Y cut lithium tantalate single crystal, each interdigital electrode includes a titanium film and an aluminum film formed thereon, and the aluminum film is a single crystal film which develops only spots on selected area electron diffraction analysis.

6 Claims, 6 Drawing Sheets

SURFACE ACOUSTIC WAVE DEVICE

CROSS-REFERENCE TO RELATED APPLICATIONS

This application claims priority to International Application No. PCT/JP99/05608 filed Oct. 12, 1999 and Japanese Application No. 11-152795, filed May 31, 1999, and the entire content of both applications is hereby incorporated by reference.

TECHNICAL FIELD

This invention relates to a surface acoustic wave device and more particularly, to a surface acoustic wave device having an electrode film with improved power durability.

BACKGROUND ART

Surface acoustic wave (SAW) devices, typically SAW filters and SAW resonators are prevalently utilized instead of dielectric filters as RF filters in mobile communication equipment such as mobile phones and cordless phones. The reason is that the SAW devices, especially SAW filters have a smaller size than the dielectric filters and when devices of the identical size are compared, the former have better electrical characteristics.

The SAW device includes at least a piezoelectric substrate, a comb-shaped electrode pattern in the form of a metal film formed on a surface of the piezoelectric substrate, and a package accommodating the piezoelectric substrate and the electrode pattern. As the piezoelectric substrate, lithium niobate, lithium tantalate and quartz crystal are used. Especially for RF band filters, lithium niobate and lithium tantalate having a large electro-mechanical coupling constant are often used. Aluminum or the like is used as the electrode pattern.

FIG. 5 illustrates one customary process for preparing a conventional SAW device. First, a piezo-electric substrate 50 is cleaned in step (a). In step (b), a metal film 51 as electrode material is deposited on the piezoelectric substrate 50 as by evaporation or sputtering. A photoresist is applied onto the metal film 51, for example, by spin coating. As shown in step (c), the photoresist is exposed in a desired pattern in an aligner and developed, obtaining a photoresist pattern 52. Thereafter, in step (d), the metal film is processed into a desired electrode pattern 53 by wet etching or dry etching. In step (e), the photoresist used for patterning is removed by using a liquid remover or ashing. At this point, the early process known as photolithographic process is completed. Thereafter, in step (f), the piezoelectric substrate having the electrode pattern formed thereon is cut into plural chips by dicing. Then in step (g), each diced chip is attached to a package with an adhesive. The next step (h) is wiring with bonding wire. Finally, a lid is welded to the package in step (i) in order to ensure air tightness. Step (j) is to inspect properties, with which the late process is completed. Recently, for the purposes of achieving further miniaturization and removing the residual inductance associated with wire bonding, a face-down connection method of facing the SAW chip to the package and accomplishing connection with metal bumps is sometimes used instead of the steps (g) and (h).

The SAW devices for use in the RF band of approximately 1 GHz have the problem of a short lifetime because the width of fingers and the distance between fingers of the comb-shaped electrode are as narrow as 1 micron. The lifetime of SAW devices mainly depends on the power durability of electrode film. As the electrode material in SAW devices, aluminum (Al) is originally used because of its low specific gravity and low electric resistance. However, when aluminum is applied to the electrode film, it is an important task to increase the power durability of the electrode film to comply with the increasing frequency of SAW devices. During the operation of SAW devices, repetitive stresses in proportion to the frequency are applied to the electrode film on the piezoelectric substrate. The repetitive stresses applied to the electrode film invite migration of aluminum atoms, which causes defects such as hillocks and voids to generate in the electrode film, significantly degrading the properties of SAW devices. This degradation phenomenon of the electrode film becomes more outstanding as the operating frequency becomes higher and as the supplied power becomes higher. It is necessary from the design requirement to reduce the thickness of the electrode film and narrow the width of electrode fingers as the frequency becomes higher. With these factors combined, the electrode film is more susceptible to defects as the frequency becomes higher. That is, a drop of the power durability is a serious problem.

As the means for improving the degradation phenomenon of the electrode film due to migration of aluminum atoms, J. I. Latham et al. disclosed to add a minor amount of a hetero metal such as copper (Cu) to aluminum to form an aluminum-copper (Al—Cu) alloy (Thin Solid Films, 64, pp. 9–15, 1979). The alloying of aluminum suppresses the generation of hillocks and voids in the electrode film and improves the power durability of SAW devices.

Many other examples of adding a minor amount of a hetero metal to aluminum to form an aluminum alloy for improving the power durability of electrodes are disclosed in JP-B 7-107967 (Al—Ti alloy), Japanese Patent No. 2,555,072 (Al—Ge alloy), JP-A 64-80113 (Al—Cu—Mg alloy), and JP-A 1-128607 (Al—Zn alloy). In these cases, by adding a minor amount of a hetero metal to aluminum, the migration of aluminum atoms is suppressed to thereby restrain the electrode from degradation. The addition of a hetero metal to aluminum, however, is not regarded preferable because this necessarily leads to an increase of the electric resistance of the electrode film, resulting in a SAW device having an increased loss.

It is believed that the diffusion rate of aluminum atoms is higher along grain boundaries than within grains, that is, grain boundary diffusion is preferential. It is thus supposed that the migration of aluminum atoms induced by repetitive stresses in SAW devices is predominant along grain boundaries, and this is already pointed out in the prior art. It is, therefore, expected that the power durability would be significantly improved if grain boundaries can be eliminated from the aluminum electrode film or substantially reduced, that is, if an aluminum electrode film can be made approximately single crystal. Since one factor of introducing an electric resistance in the electrode film is scattering of electrons at grain boundaries, the elimination of grain boundaries is preferable in that the electric resistance is reduced and hence, the loss of SAW devices is reduced.

It is already disclosed in JP-A 55-49014 that a substantially single crystal electrode material is applied to the electrode film of SAW device. Allegedly, the use of a substantially single crystal electrode material can enhance the performance of the SAW device independent of the type of material of which the SAW device is constructed. The publication describes that a molecular beam epitaxy method is recommended as the method for forming such an electrode film. The publication is silent about what electrode material is deposited on what substrate material under what conditions to form a film, but merely discloses the general discussion that a performance improvement of SAW device is expectable from the use of the above-described single crystal electrode film. It is unclear how much Q value and aging properties are improved. Additionally stated, the molecular beam epitaxy method has problems against the low cost manufacture of SAW devices including an expensive system and a slow film deposition rate.

An illustrative example of applying a single crystal or crystallographically unidirectionally oriented aluminum film to the electrode film of SAW device is disclosed in Japanese Patent No. 2,545,983. In this patent, by using a rotated Y cut quartz crystal substrate in the range of 25 degree rotated Y cut to 39 degree rotated Y cut as the piezoelectric substrate, and effecting evaporation at a high rate (deposition rate 40 Å/sec) and a low temperature (substrate temperature 80° C.), there is obtained a (311) oriented film, which is allegedly an epitaxially grown film close to single crystal. Although it is likely in the case of low temperature evaporation that the adhesion between the underlying quartz crystal substrate and the aluminum electrode film (that is, film bond strength) becomes a problem, the patent indicates that a very thin Ti or Cr film is formed between the quartz crystal substrate and the aluminum film to such an extent that the orientation of the aluminum film is not impaired.

By the way, in the RF band filters where the power durability of the electrode film becomes a serious problem as previously mentioned, lithium niobate and lithium tantalate are often used as the piezoelectric substrate because of their electromechanical coupling constant. In particular, a 36 degree rotated Y cut lithium tantalate has a higher temperature stability than lithium niobate. Therefore, a 36 degree rotated Y cut lithium tantalate substrate is used in the application where temperature stability is of importance.

However, the above-referred Japanese Patent No. 2,545,983 merely discloses the (311) orientation of an aluminum film when quartz crystal is used as the piezoelectric substrate, but describes nowhere the use of lithium tantalate as the substrate.

Also, JP-A 5-199062 discloses the use of an aluminum single crystal film as the electrode film of a SAW device and a means for forming the aluminum single crystal film. ST or LST cut quartz crystal is used therein as the piezoelectric substrate. Allegedly, a surface of the substrate is formed to an island-like structure where minute hemispherical islands are distributed substantially uniformly, which allow an aluminum single crystal film to be formed by evaporation or sputtering. As the technique of forming and processing the substrate surface to the island-like structure, a prior art etching technique is allegedly applicable. It is described that like quartz crystal, lithium niobate useful in constructing RF band filters, for example, is also effective as the means for forming the aluminum single crystal film, but there are shown neither illustrative examples nor data about the material other than quartz crystal.

JP-A 6-132777 discloses another prior art technique relating to an aluminum single crystal film. It is shown that an aluminum single crystal film is obtained when deposited on a very flat clean crystal surface at a very low deposition rate. It is specifically described that formation of an aluminum single crystal film on a LST cut quartz crystal substrate by vacuum evaporation, formation of an aluminum single crystal film on a 128 degree rotated Y cut lithium niobate substrate by vacuum evaporation, and formation of an aluminum single crystal film on a 112 degree X cut lithium tantalate substrate by vacuum evaporation are possible. However, this method requires to keep the substrate crystal surface clean in a reproducible manner and to slow down the film formation rate, probably leaving a problem against mass production. The publication refers nowhere the 36 degree rotated Y cut lithium tantalate.

JP-A 7-135443 describes a SAW device comprising a single crystal piezoelectric substrate of quartz crystal, lithium tantalate, lithium niobate, lithium tetraborate, etc., an underlying film formed of a metal or compound which is less reactive with aluminum to a thickness of 1 to 30 Å, and electrode wiring of aluminum or aluminum alloy on the underlying film. In Example of the publication, SAW devices are fabricated using a 64° rotated Y cut lithium niobate substrate, B, C, Si, Ge, SiC, BN and $Si_3N_4$ as the constituent material of the underlying film, and an Al film as the electrode wiring. In a comparative example, a SAW device having an underlying film of Ti is fabricated. It is described that in all of the examples and comparative example, the Al film has a (111) unidirectionally oriented structure, but not that the Al film is a single crystal film. The publication describes that when another substrate such as a 36° rotated Y cut lithium tantalate substrate is used, no significant difference is found as compared with the use of the 64° rotated Y cut lithium niobate substrate.

JP-A 8-204483 describes a method for preparing a SAW device in which an aluminum or aluminum alloy film of (100), (110) or (111) oriented single crystal is formed on a lithium tantalate or lithium niobate single crystal piezoelectric substrate. The method of this publication requires to remove the affected surface layer from the substrate by ion beam etching under specific conditions, in order to form comb-shaped electrodes from a single crystal film. Then this method is less amenable to mass production.

JP-A 8-154030 describes a SAW device comprising an electrode film in the form of a (111) oriented epitaxial film on a $LiNbO_3$ or $LiTaO_3$ substrate wherein the crystallographic plane of the substrate is selected such that the lattice misfit between the electrode material and the substrate may have a positive value of less than 10.0%, thereby minimizing crystal defects in the electrode film. It is described in Example of the publication that a misfit of +5.1% is achievable using a (013) face $LiTaO_3$, that is, $LiTaO_3$ having a rotated cut angle of 40 to 48°. It is alleged in the publication that on the assumption that the electrode film is previously formed as a (111) oriented epitaxial film independent of the number of defects, the quantity of misfit affects the number of defects in the electrode film. The present inventors carried out powder x-ray diffraction on an Al film which was formed on a $LiTaO_3$ substrate having a rotated cut angle of 40 to 48°, in which many diffraction peaks indicating that this Al film is a polycrystalline film, especially outstanding diffraction peaks indicating Al (111) developed. That is, this Al film was a polycrystalline film intensely oriented in (111) and a single crystal Al film could not be formed. It is presumed from this fact that the (111) oriented epitaxial film described in the above publication merely indicates a highly oriented film whose crystal has grown while being oriented in conformity with the crystal structure of the substrate, but not a single crystal film.

Also, JP-A 9-167936 describes a SAW device comprising a $LiTaO_3$ substrate and an electrode pattern formed on the substrate surface and composed mainly of Al wherein the $LiTaO_3$ substrate has an orientation rotated an angle of 38 to 46° about X axis from Y axis toward Z axis. In this publication, by setting the cut angle at a large angle for 36° rotated Y cut LiTaO₃, an enlargement of the bandwidth and an improvement in squareness ratio in the high-frequency region are achieved. The cut angle described in the publication is approximate to that of the above-referred JP-A 8-154030, but no reference is made to the crystallinity of the Al electrode pattern.

JP-A 5-183373 describes that an electrode material of (111) face orientation ensuring the closest packing is formed on a piezoelectric substrate of LiTaO₃, etc. The publication, however, does not describe specific means necessary for forming an electrode film of (111) face orientation. In Example where an Al film of about 2,000 Å thick was evaporated on a 36° rotated Y-X cut LiTaO₃ substrate by ion beam sputtering, a (111) oriented film was obtained when an ionic current of 100 mA, an accelerating voltage of 1,400 eV, and a substrate temperature of 140° C. were set. The inventors of this publication presented substantially the same contents as that invention in the literature, Jpn. J. Appl. Phys., Vol. 33, pp. 3015–3017, 1994. The Al film described in this article is apparently judged to be polycrystalline from an electron microscope image of its surface, and also judged to be a highly oriented film intensely oriented in (111) face rather than single crystal, from a RHEED (reflection high energy electron diffraction) image.

WO 99/16168 describes a SAW device comprising a 36° rotated Y cut lithium tantalate piezoelectric substrate and interdigital electrodes formed thereon, wherein the interdigital electrodes include a titanium underlying metal film and an aluminum film formed thereon, the titanium underlying metal film is at least 330 Å thick, and the aluminum film is a (111) oriented polycrystalline film. That is, a single crystal Al film is not obtained in this publication.

JP-A 59-55615 describes in Example a combination of a piezoelectric substrate material, a constituent material of an electrically conductive material thin film second layer formed thereon and a constituent material of an electrically conductive material thin film first layer formed thereon. For instance, the combination of Example 9 selects LiTaO₃ as the substrate material, Ti as the second layer constituent material thereon, and Al as the first layer constituent material thereon. However, in the Examples of this publication, no reference is made to the cut orientation of the substrate and the crystallography of the first layer serving as the electrode film.

DISCLOSURE OF THE INVENTION

As discussed above on the basis of the heretofore disclosed prior art technology, the growing concern about a SAW device is the power durability of an aluminum electrode film used therein. To solve the problem, a means for making the electrode film single crystal or substantially single crystal has been proposed. Since grain boundaries are absent or rarely present in the single crystal or substantially single crystal electrode film, the diffusion of aluminum atoms along grain boundaries is restrained and the electric resistance is reduced, accomplishing an improved power durability.

Since 36 degree rotated Y cut lithium tantalate has good temperature stability, a SAW device having improved temperature stability and power durability is realized if a single crystal or substantially single crystal electrode film can be formed thereon.

However, the heretofore disclosed single crystal film forming technology has the drawbacks that the equipment is expensive, the film growth rate is so slow as to impede mass production, and the substrate used is limited to quartz crystal. In the case of an approximately 36 degree rotated Y cut lithium tantalate piezoelectric substrate which is optimum to construct an RF band filter where the power durability of the electrode film is a problem, means for readily forming a single crystal aluminum electrode film has not been proposed.

An object of the invention is to provide a SAW device having an electrode film on a lithium tantalate substrate having a cut angle in proximity to 36 degree rotated Y cut, the electrode film including an aluminum single crystal film having improved power durability.

The above object is attained by the following construction.

(1) A surface acoustic wave device having interdigital electrodes on a substrate,
    the substrate is constructed of a 38 to 44 degree rotated Y cut lithium tantalate single crystal,
    each interdigital electrode includes a titanium film and an aluminum film formed on the titanium film,
    the aluminum film is a single crystal film which develops only spots on selected area electron diffraction analysis.
(2) The SAW device of (1) wherein a direction normal to the (112) face of the aluminum film or a face crystallographically equivalent thereto is oriented perpendicular to the surface of the substrate.
(3) The SAW device of (1) or (2) wherein the substrate is constructed of a 40 to 42 degree rotated Y cut lithium tantalate single crystal.
(4) The SAW device of any one of (1) to (3) wherein the titanium film has a thickness of 10 Å to less than 1,000 Å.

BEST MODE FOR CARRYING OUT THE INVENTION

Figure 1:
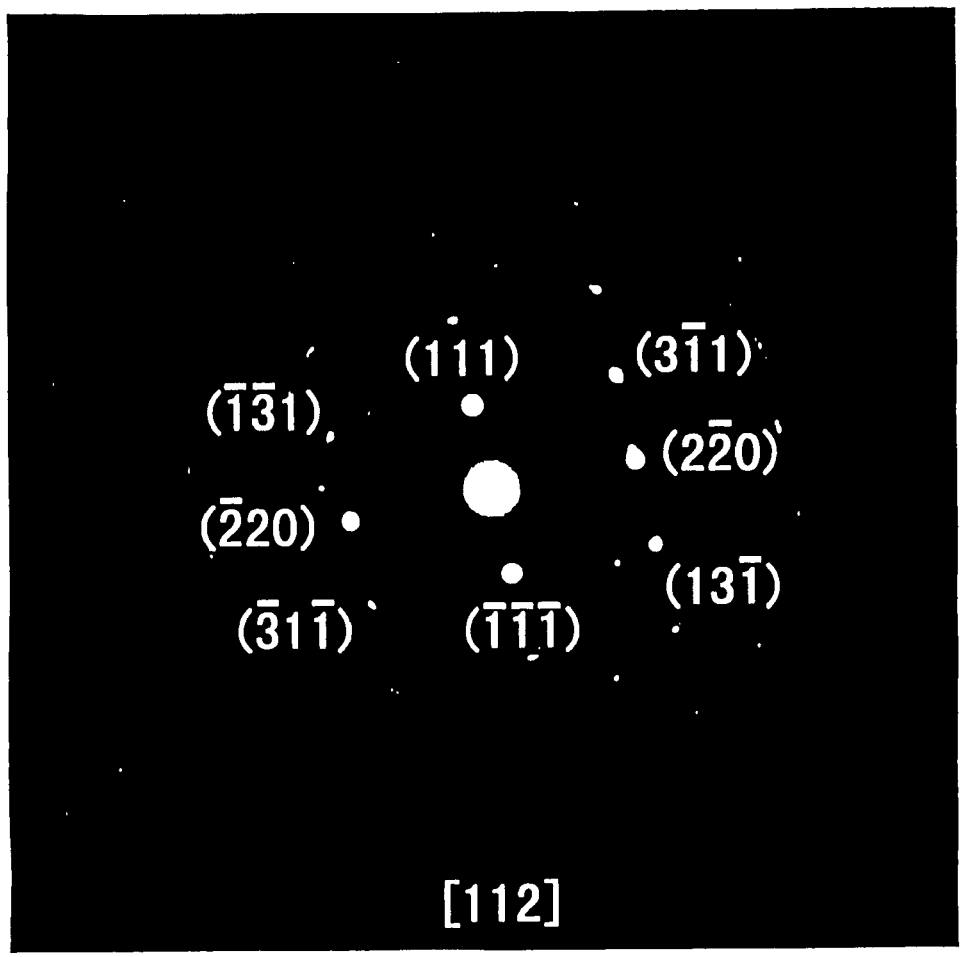
FIG. 1 is a figure-substitute photograph showing a crystal structure and a selected area electron diffraction image of a sample having a titanium film of 100 Å thick and an aluminum film of 3,000 Å thick formed on a 40 degree rotated cut lithium tantalate substrate.

Making an empirical study, the present inventors attempted to form a single crystal aluminum film on a lithium tantalate substrate in proximity to 36 degree rotated Y cut which is commonly used as the piezoelectric substrate for RF band filters. As a result, the inventors have found that when the cut orientation for crystal cutting is increased from the 36 degree rotated Y commonly used in the prior art to a larger angle side, that is, 38 degree to 44 degree rotated Y. a titanium film is formed on this substrate, and an aluminum film is formed on this titanium film, the aluminum film becomes a single crystal film. In a SAW device using the thus formed aluminum single crystal film as an electrode film, the power durability of the electrode film is drastically improved.

The SAW device of the invention includes a substrate having a surface and at least one pair of interdigital electrodes (or comb-shaped electrodes) formed on the substrate surface. The interdigital electrodes each include a titanium film formed on the substrate and an aluminum film formed on the titanium film.

The substrate is constructed of a 38 to 44 degree rotated Y cut lithium tantalate single crystal. That is, the cut orientation employed herein is an orientation rotated an angle in the range of 38 to 44 degrees about X axis as an axis of rotation from Y axis toward Z axis. If the cut orientation of the substrate is on a smaller angle side than the 38 degree rotation, it is impossible to form the titanium film and aluminum film into single crystal films. On the other hand, if the cut orientation of the substrate is on a larger angle side than the 44 degree rotation, the propagation loss of surface waves increases and this loss increase becomes outstanding in the frequency band that requires to reduce the thickness of the aluminum film below 1 µm. To further reduce the propagation loss, the cut orientation is preferably set to 40 to 42 degree rotated Y.

The cut orientation of the substrate can be confirmed by x-ray diffraction. The size of the substrate is not critical although the substrate generally has a dimension of about 1 to 10 mm in the propagation direction of surface acoustic waves and a dimension of about 0.5 to 5 mm in a transverse direction when it is applied to SAW devices. It is noted that in the step of forming electrodes, a round substrate having a diameter of 3 inches is generally used, and a number of interdigital electrodes are simultaneously formed on the substrate.

In the invention, the aluminum film is a single crystal film. As used herein, the "single crystal film" means a film which develops only spots on selected area electron diffraction analysis. In RHEED (reflection high energy electron diffraction) analysis, whether or not spots develop and additionally, whether or not streaks are seen become the criteria for determining whether or not the film is single crystal. In the selected area electron diffraction, the development of spots is just the criterion for judging that the film is single crystal. Inversely, if the film is polycrystalline, a ring-like pattern develops in a selected area electron diffraction image.

It is noted that for the single crystal film which develops only spots on selected area electron diffraction analysis, no diffraction peaks are found in a powder x-ray diffraction pattern. On analysis by a powder x-ray diffractometer, a film itself is analyzed by a conventional powder x-ray diffractometer to produce an x-ray diffraction pattern rather than comminuting the film into a powder on which an x-ray diffraction pattern is determined.

In the practice of the invention, the aluminum film is often a single crystal film in which a direction normal to the (112) face or a face crystallographically equivalent thereto is oriented perpendicular to the surface of the substrate.

The titanium film underlying the aluminum film becomes more desirable as the titanium purity increases. A titanium film with a purity of at least 99.9% is preferably used. The thickness of the titanium film is preferably at least 10 Å in order to form a homogeneous film and also preferably less than 1,000 Å, more preferably up to 800 Å and most preferably up to 600 Å in order to allow the aluminum film to become a single crystal film.

The method of forming the titanium film is not critical although vapor phase growth methods such as evaporation and sputtering are preferably used. For the titanium film, the rate of deposition is preferably about 0.1 to 10 Å/sec from the standpoint of film thickness control.

The method of forming the aluminum film is not critical although vapor phase growth methods such as evaporation and sputtering are preferably used. For the aluminum film, the rate of deposition is preferably about 10 to 50 Å/sec. The thickness of the aluminum film may be suitably determined in accordance with the frequency band to which the SAW device is applied. A thickness of 0.2 to 1 µm is often employed for RF band filters adapted to operate at a frequency in the range of about 800 MHz to 2 GHz.

Fingers of the interdigital electrodes have a width which may be suitably determined in accordance with the frequency band to which the SAW device is applied. For example, a finger width of about 0.5 to 1.3 µm is usually employed for the frequency band of 800 MHz to 2 GHz.

EXAMPLE

First, there were furnished a 40 degree rotated Y cut lithium tantalate substrate (referred to as 40LT, hereinafter), a 42 degree rotated Y cut lithium tantalate substrate (referred to as 42LT, hereinafter), and a conventional commonly used 36 degree rotated Y cut lithium tantalate substrate (referred to as 36LT, hereinafter) as a comparative example. The substrates were cleaned by a series of steps involving ultrasonic cleaning in a neutral detergent solution, pure water rinsing, ultrasonic cleaning in isopropyl alcohol, ultrasonic cleaning in acetone, ultrasonic cleaning in isopropyl alcohol again, pure water rinsing, and drying.

On each substrate, a titanium film with a thickness as shown in Table 1 and an aluminum film with a thickness of 3,000 Å were formed to construct an electrode film, obtaining a test sample. A sample without a titanium film was also fabricated. For the formation of each film, electron beam evaporation was employed. The evaporation sources used were aluminum with a purity of 99.999% and titanium with a purity of 99.99%. During evaporation, the ultimate pressure was $1.0 \times 10^{-4}$ Pa and the substrate was at a temperature of 100 to 150° C. The deposition rate for aluminum was about 30 Å/sec. The deposition rate for titanium was set as low as 1 to 5 Å/sec for ease of film thickness control because an extremely thin film was to be formed.

Next, the electrode film on each sample was examined for crystallinity by selected area electron diffractometry.

Figure 2:
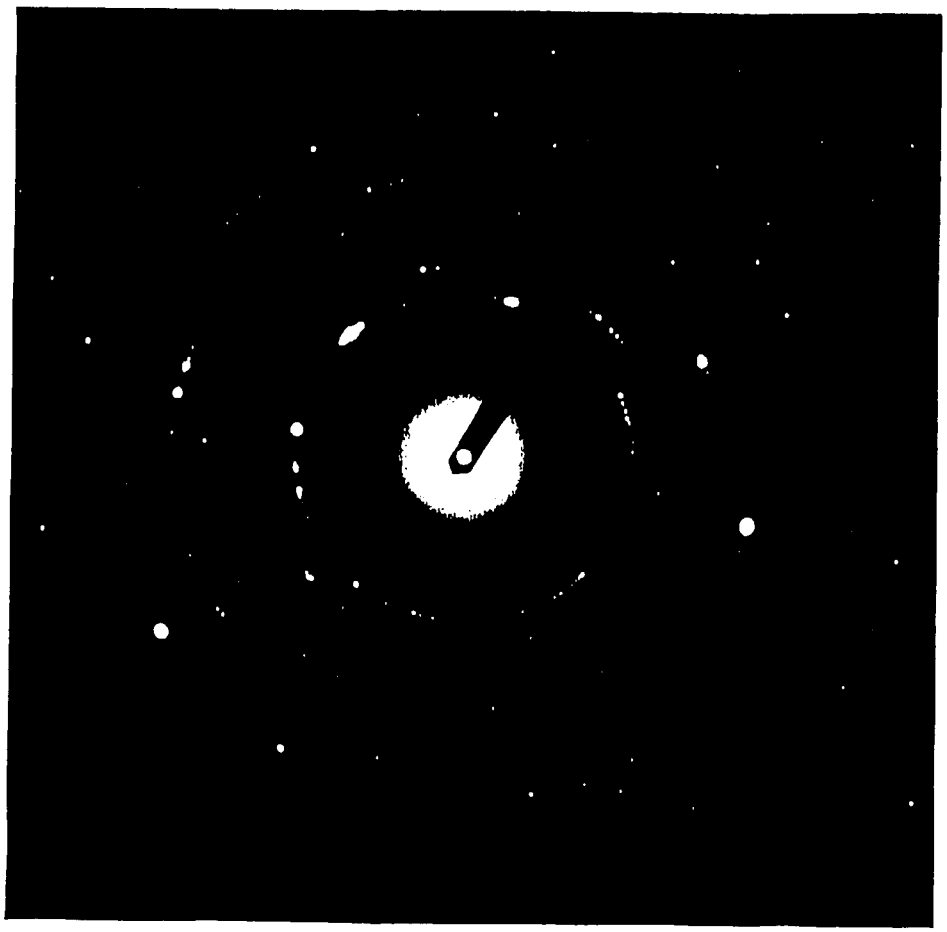
FIG. 2 is a figure-substitute photograph showing a crystal structure and a selected area electron diffraction image of a sample having a titanium film of 100 Å thick and an aluminum film of 3,000 Å thick formed on a 36 degree rotated Y cut lithium tantalate substrate.

FIG. 2 is a selected area electron diffraction image of the sample in which a titanium film of 100 Å thick was formed on the 36LT substrate and an aluminum film of 3,000 Å thick was formed thereon. In this selected area electron diffraction image, a ring-like pattern developed, indicating that the aluminum film was polycrystalline.

FIG. 1 is a selected area electron diffraction image of the sample in which a titanium film of 100 Å thick was formed on the 40LT substrate and an aluminum film of 3,000 Å thick was formed thereon. In this selected area electron diffraction image, only a spot pattern developed, indicating that the aluminum film was single crystal. Based on the spot position shown in FIG. 1 and the camera length inherent to the diffractometer, the face indices of these spots were determined to find that the electron beam incident direction in FIG. 1 was the [112] axis direction. Therefore, in this single crystal aluminum film, the (112) face or a face crystallographically equivalent thereto grew, and a direction normal to these faces was oriented perpendicular to the substrate surface.

The sample in which a titanium film of 100 Å thick was formed on the 42LT substrate and an aluminum film of 3,000 Å thick was formed thereon was also examined by selected area electron diffractometry. It was confirmed that this aluminum film was a single crystal film and a direction normal to the (112) face or a face crystallographically equivalent thereto was oriented perpendicular to the substrate surface.

Figure 3:
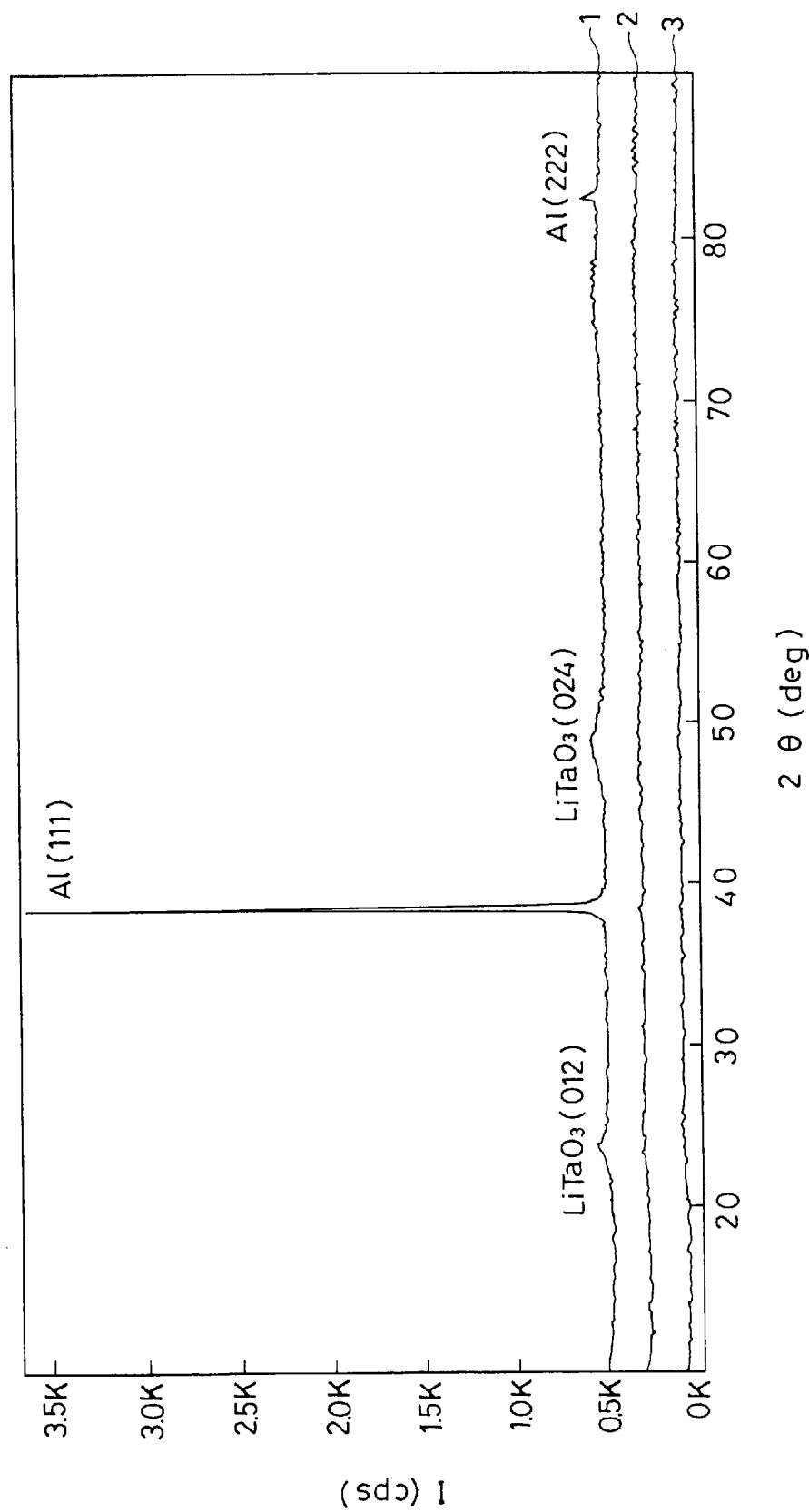
FIG. 3 is a diagram showing a powder x-ray diffraction pattern of a sample having a titanium film of 100 Å thick and an aluminum film of 3,000 Å thick formed on a lithium tantalate substrate, wherein Curve 1 corresponds to a 36 degree rotated Y cut substrate, Curve 2 corresponds to a 40 degree rotated Y cut substrate, and Curve 3 corresponds to a 42 degree rotated Y cut substrate.
Figure 4:
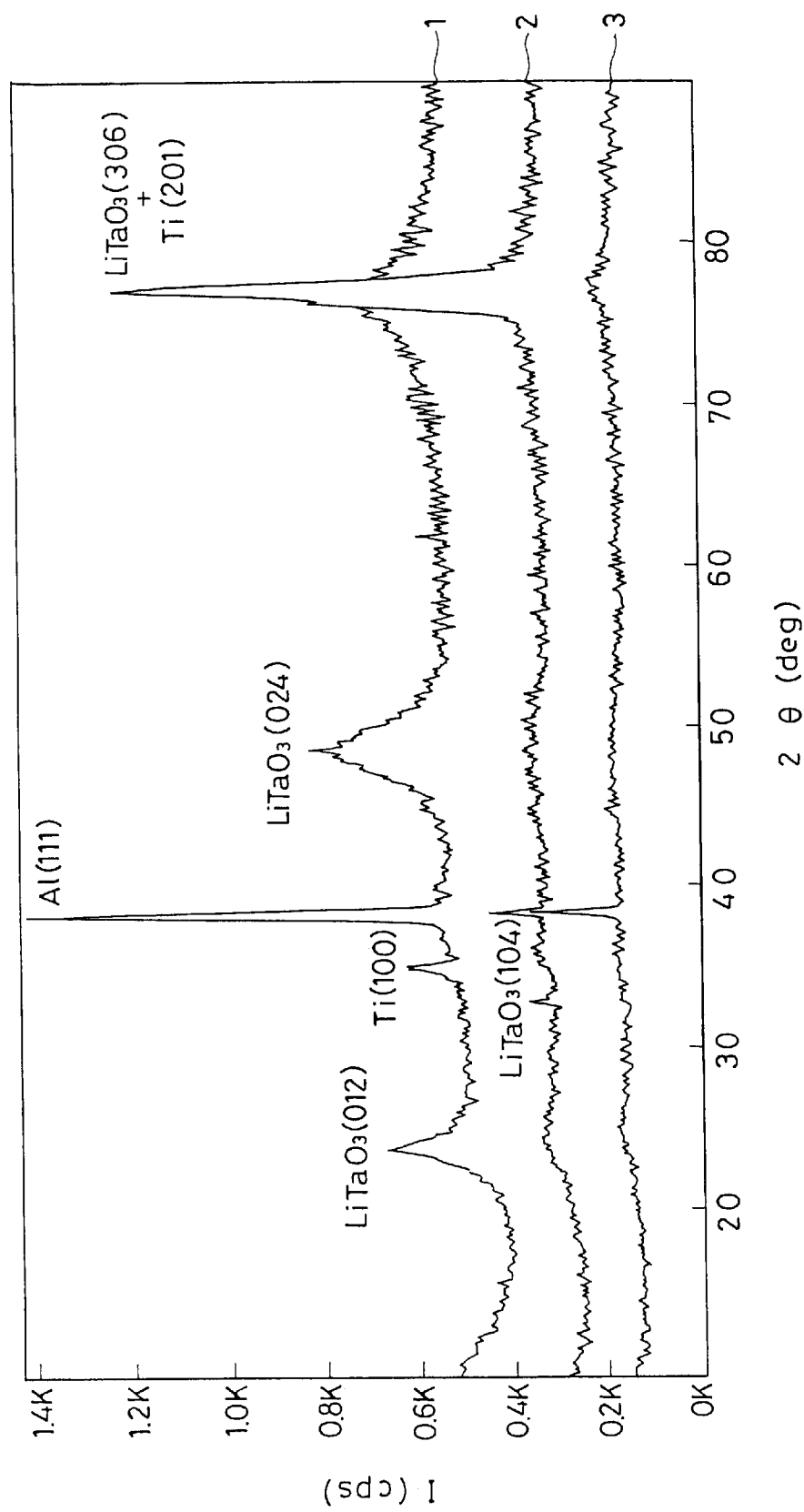
FIG. 4 is a diagram showing a powder x-ray diffraction pattern of a sample having a titanium film of 1,000 Å thick and an aluminum film of 3,000 Å thick formed on a lithium tantalate substrate, wherein Curve 1 corresponds to a 36 degree rotated Y cut substrate, Curve 2 corresponds to a 40 degree rotated Y cut substrate, and Curve 3 corresponds to a 42 degree rotated Y cut substrate.
Figure 5:
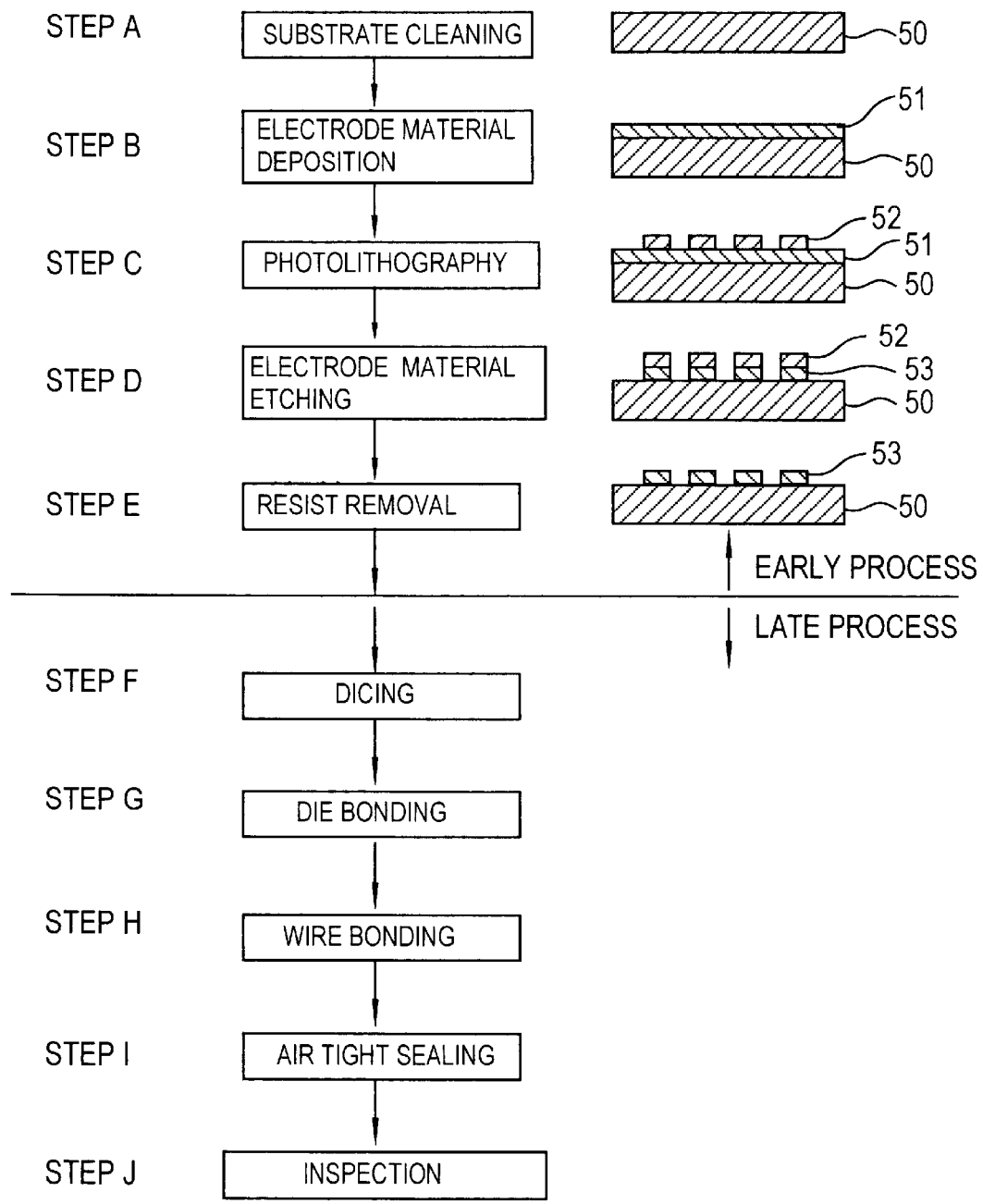
FIG. 5 is a diagram showing a process for fabricating a SAW device.

Further, the electrode film on each sample was examined for crystallinity by an ordinary powder x-ray diffractometer model XMP18 (Mac Science Co.). FIG. 3 shows diffraction curves of samples having a titanium film of 100 Å thick, and FIG. 4 shows diffraction curves of samples having a titanium film of 1,000 Å thick. In FIGS. 3 and 4, Curve 1 corresponds to the 36LT substrate, Curve 2 corresponds to the 40LT substrate, and Curve 3 corresponds to the 42LT substrate.

It is seen from FIG. 3 that in the case of 36LT substrate (Curve 1), the (111) diffraction peak of aluminum is definitely observed, indicating that this aluminum film is a highly (111) oriented polycrystalline film. In the case of 40LT substrate (Curve 2) and 42LT substrate (Curve 3), no diffraction peak of aluminum is observed, indicating that the aluminum film is a single crystal film. It is noted that broad small peaks observed in FIG. 3 are deemed due to reflection from the lithium tantalate crystal of the substrate.

On the other hand, in FIG. 4, the (111) diffraction peak of aluminum is observed on all the samples. It is thus understood that the aluminum film does not become a single crystal film when the titanium film has a thickness of 1,000 Å.

For the aluminum films of all the samples fabricated herein, the results of selected area electron diffraction are shown in Table 1. In Table 1, the sample is rated "O" when it is confirmed that the aluminum film is a single crystal film and a direction normal to the (112) face or a face crystallographically equivalent thereto is oriented perpendicular to the substrate surface. The sample is rated "X" when the aluminum film is judged to be a polycrystalline film. Also, when evaluation was made by powder x-ray diffractometry, no diffraction peak was ascertained on the film judged to be a single crystal film, but a diffraction peak was ascertained on the film judged to be a polycrystalline film.

TABLE 1

| Titanium film thickness (Å) | Substrate | | |
| --- | --- | --- | --- |
| | 36 LT | 40 LT | 42 LT |
| — | X | X | X |
| 50 | X | O | O |
| 100 | X | O | O |
| 500 | X | O | O |
| 1000 | X | X | X |

Table 1 reveals the advantages obtained when the cut orientation of crystal cutting is set within the range limited by the invention and a titanium film is formed as the undercoat for the aluminum film.

Next, it was examined whether the power durability of the electrode film was actually improved by the invention. A ladder type SAW filter designed for 800 MHz band was used as the SAW device for testing power durability.

The test samples were an inventive filter having on a 42LT substrate an electrode film consisting of a titanium film of 100 Å thick and an aluminum film of 4,000 Å thick, and a comparative filter having an electrode film in the form of an aluminum film of 4,000 Å thick formed directly on a 36LT substrate. The samples were examined by selected area electron diffractometry and powder x-ray diffractometry, finding that the aluminum film in the inventive filter was single crystal, but the aluminum film in the comparative filter was a (111) oriented polycrystalline film. The film forming conditions were the same as in the above samples. The pitch of electrode fingers, that is, the wavelength of surface acoustic waves was about 4.5 μm.

Figure 6:
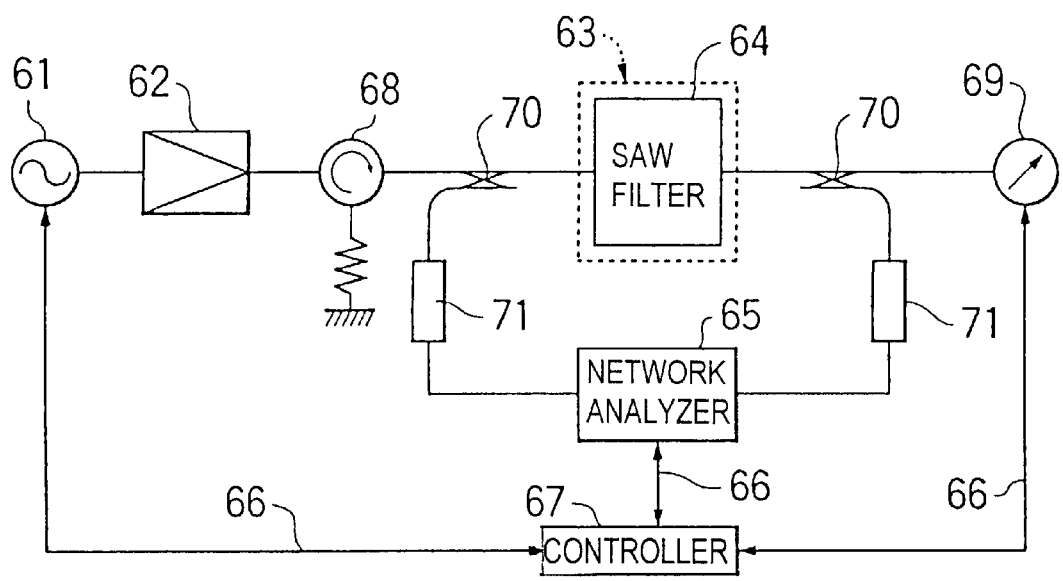
FIG. 6 is a diagram showing a measurement circuit for testing the power durability of a SAW device.

In testing power durability (life test), the highest frequency within the pass-band of the filter was used. Accelerating conditions included an ambient temperature of 80° C. and an input power of 28 dBm. FIG. 6 shows a measurement circuit for the power durability test used in the experiment. In FIG. 6, an oscillator 61 generates a high frequency signal which is amplified to 28 dBm by a high-frequency amplifier 62 and supplied through an isolator 68 to a SAW filter 64 in a thermostat chamber 63 at 80° C. The SAW filter 64 is connected to a high-frequency wattmeter 69. To measure electrical properties upon power supply, a network analyzer 65 is connected across the SAW filter 64 through directional couplers 70 and attenuators 71. A controller 67 is connected to the oscillator 61, high-frequency wattmeter 69 and network analyzer 65 via GP-IB cables 66 for controlling these units.

The power durability (device life) was evaluated in terms of time to failure (TF) when the insertion loss of the filter increased 0.5 dB. The inventive filter showed about 20,000 times longer a lifetime than the comparative filter. It was confirmed that the power durability of the electrode film was dramatically improved by the invention.

BENEFITS OF THE INVENTION

In the SAW device of the invention, the substrate is constructed by lithium tantalate with a cut angle in proximity to 36 degree rotated Y cut that has better temperature stability than lithium niobate, and the aluminum film in the electrode film is a single crystal film. Then the SAW device of the invention has excellent temperature stability and the electrode film has excellent power durability. Therefore, the invention is effective for increasing the lifetime of filters which must use fine comb-shaped electrodes, for example, RF band filters for use in mobile communication equipment. In addition, simply by selecting the cut orientation of the substrate and forming a. titanium film as the undercoat, the invention ensures that an aluminum film is always formed as a single crystal film. Consequently, the SAW device of the invention can be mass manufactured at a relatively low cost.

What is claimed is:

1. A surface acoustic wave device having interdigital electrodes on a substrate,
    said substrate is constructed of a 38 to 44 degree rotated Y cut lithium tantalate single crystal,
    each said interdigital electrode includes a titanium film and an aluminum film formed on the titanium film,
    said aluminum film is a single crystal film which develops only spots on selected area electron diffraction analysis.

2. The surface acoustic wave device of claim 1 wherein a direction normal to the (112) face of said aluminum film or a face crystallographically equivalent thereto is oriented perpendicular to the surface of the substrate.

3. The surface acoustic wave device of claim 1 or 2 wherein said substrate is constructed of a 40 to 42 degree rotated Y cut lithium tantalate single crystal.

4. The surface acoustic wave device of claim 1 wherein said titanium film has a thickness of 10 Å to less than 1,000 Å.

5. The surface acoustic wave device of claim 2 wherein said titanium film has a thickness of 10 Å to less than 1,000 Å.

6. The surface acoustic wave device of claim 3 wherein said titanium film has a thickness of 10 Å to less than 1,000Å.

* * * * *